(12) United States Patent
Chen et al.

(10) Patent No.: US 6,819,002 B2
(45) Date of Patent: Nov. 16, 2004

(54) UNDER-BALL-METALLURGY LAYER

(75) Inventors: William Tze-You Chen, Endicott, NY (US); Ho-Ming Tong, Taipei (TW); Chun-Chi Lee, Kaohsiung (TW); Su Tao, Kaohsiung (TW); Jeng-Da Wu, Kaohsiung Hsien (TW); Chih-Huang Chang, Tainan Hsien (TW); Po-Jen Cheng, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/604,795

(22) Filed: Aug. 18, 2003

(65) Prior Publication Data
US 2004/0104484 A1 Jun. 3, 2004

(30) Foreign Application Priority Data
Oct. 25, 2002 (TW) .......................................... 91125098 A

(51) Int. Cl.[7] .......................... H01L 23/48; H01L 23/52; H01L 29/40
(52) U.S. Cl. ...................... 257/779; 257/780; 257/781; 257/761; 257/762; 257/763; 257/764; 257/766; 257/738; 257/772
(58) Field of Search ................................ 257/772, 779, 257/780, 781, 761, 762, 763, 764, 766, 738

(56) References Cited
U.S. PATENT DOCUMENTS
6,452,270 B1 * 9/2002 Huang .......................... 257/738
* cited by examiner Primary Examiner—Steven Loke
(74) Attorney, Agent, or Firm—Jiang Chyun IP Office

(57) ABSTRACT

An under-ball-metallurgy layer between a bonding pad on a chip and a solder bump made with tin-based material is provided. The under-ball-metallurgy layer at least includes an adhesion layer over the bonding pad, a nickel-vanadium layer over the adhesion layer, a wettable layer over the nickel-vanadium layer and a barrier layer over the wettable layer. The barrier layer prevents the penetration of nickel atoms from the nickel-vanadium layer and reacts with tin within the solder bump to form inter-metallic compound. This invention also provides an alternative under-ball-metallurgy layer that at least includes an adhesion layer over the bonding pad, a wettable layer over the adhesion layer and a nickel-vanadium layer over the wettable layer. The nickel within the nickel-vanadium layer may react with tin within the solder bump to form an inter-metallic compound.

19 Claims, 5 Drawing Sheets

UNDER-BALL-METALLURGY LAYER

CROSS REFERENCE TO RELATED APPLICATIONS

This application claims the priority benefit of Taiwan application serial no. 91125098, filed Oct. 25, 2002.

BACKGROUND OF INVENTION

1. Field of Invention

The present invention relates to an under-ball-metallurgy layer. More particularly, the present invention relates to an under-ball-metallurgy layer structure capable of increasing the bonding strength between the bonding pad on a chip and a solder bump.

2. Description of Related Art

Flip chip bonding technique is a method of joining a chip with a substrate or a printed circuit board (PCB). The chip has an active surface with a plurality of bonding pads arranged into an array. Each bonding pad on the chip has an under-ball-metallurgy layer (UBM) and a solder bump. Hence, the solder bumps may connect with a corresponding set of contact pads on the substrate or printed circuit board when the chip is flipped over. Note that the flip chip technique is able to produce a high-pin-count package with a smaller overall area and a shorter circuit length. Consequently, most semiconductor manufacturers have adopted the flip chip technique to fabricate chip packages, especially the high pin count packages.

FIG. 1 is a schematic cross-sectional view of a portion of a conventional flip chip. As shown in FIG. 1, the flip chip 100 includes a chip 110, an under-ball-metallurgy layer 120 and a plurality of solder bumps 130 (only one is shown). The chip 110 has an active surface 112 with a passivation layer 114 and a plurality of bonding pads 116 thereon. The passivation layer 114 exposes the bonding pads 116. Note that the active surface 112 of the chip 110 is the side of the chip 110 having most active devices. The under-ball-metallurgy layer 120 is formed between the bonding pad 116 and the solder bump 130 to serve as a junction interface.

The under-ball-metallurgy layer 120 further includes an adhesion layer 122, a barrier layer 124 and a wettable layer 126. The adhesion layer 122 is fabricated using a material such as aluminum or titanium for boosting the bonding strength between the bonding pad 116 and the barrier layer 124. The barrier layer 124 is fabricated using a material such as nickel-vanadium alloy for preventing the diffusion of metallic atoms from a metallic layer above the barrier layer 124 to a metallic layer below the barrier layer 124 and vice versa. The wettable layer 126 is fabricated using a material such as copper for boosting the wetting capacity of the under-ball-metallurgy layer 120 towards solder bump 130 material. Note that lead-tin alloy is normally used to fabricate the solder bump 130 due to its greater overall bonding strength. However, because of possible pollution of the environment, lead-free solder material is often adopted. In general, both lead-containing and lead-free material contains tin as a principle ingredient.

If copper is a major constituent of the wettable layer 126, tin within the solder bump 130 may react with copper inside the wettable layer 126 during a reflow process and lead to the formation of inter-metallic compound (IMC), in other words, $Cu_6Sn_5$. Gradually, an inter-metallic compound (IMC) layer (not shown) is formed between the wettable layer 126 and the solder bump 130. In addition, if nickel-vanadium alloy is a major constituent of the barrier layer 124, tin within the solder bump 130 may first react with copper inside the wettable layer 126 to form an inter-metallic compound (IMC) $Cu_6Sn_5$. Thereafter, tin within the solder bump 130 may continue to react with nickel within the barrier layer 124 to form another inter-metallic compound $Ni_3Sn_4$. Note that tin within the solder bump 130 and nickel within the barrier layer 124 react to produce inter-metallic compound $Ni_3Sn_4$, which is lumpy and discontinuous, after a long reflow process. In the presence of the lumpy inter-metallic compound, bonding strength of the solder bump 130 to the underlying under-ball-metallurgy layer 120 is weakened. Hence, the solder bump 130 may peel off from the chip leading to a deterioration of product reliability and yield.

SUMMARY OF INVENTION

Accordingly, one object of the present invention is to provide an under-ball-metallurgy layer between a bonding pad of a chip and a solder bump for reducing the growth rate of inter-metallic compound $Ni_3Sn_4$. Ultimately, bonding strength between solder bump and bonding pad can be maintained for a very long time and working life of associated chip package can be extended.

To achieve these and other advantages and in accordance with the purpose of the invention, as embodied and broadly described herein, the invention provides an under-ball-metallurgy layer structure between a bonding pad of a chip and a tin-based solder bump. The under-ball-metallurgy layer at least includes an adhesion layer over the bonding pad, a nickel-vanadium layer over the adhesion layer, a wettable layer over the nickel-vanadium layer and a barrier layer over the wettable layer. The barrier layer prevents the penetration of nickel atoms from the nickel-vanadium layer and reacts with tin within the solder bump to form inter-metallic compound. In addition, the barrier layer is fabricated using a material selected from a group consisting of nickel, iron and cobalt. Furthermore, the under-ball-metallurgy layer may include another wettable layer over the nickel-vanadium layer.

This invention also provides an alternative under-ball-metallurgy layer structure between a bonding pad of a chip and a tin-based solder bump. The under-ball-metallurgy layer at least includes an adhesion layer over the bonding pad, a wettable layer over the adhesion layer and a nickel-vanadium layer over the wettable layer. The nickel-vanadium layer may react with tin within the solder bump to form inter-metallic compound. Furthermore, the under-ball-metallurgy layer may include another wettable layer over the nickel-vanadium layer.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
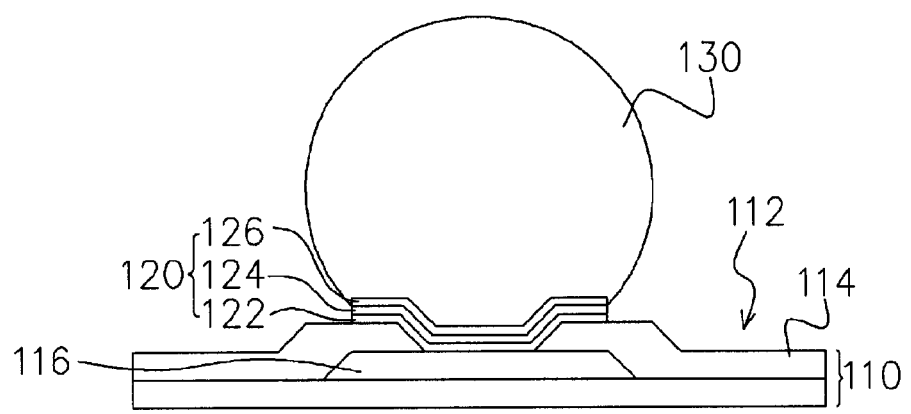
FIG. 1 is a schematic cross-sectional view of a portion of a conventional flip chip.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
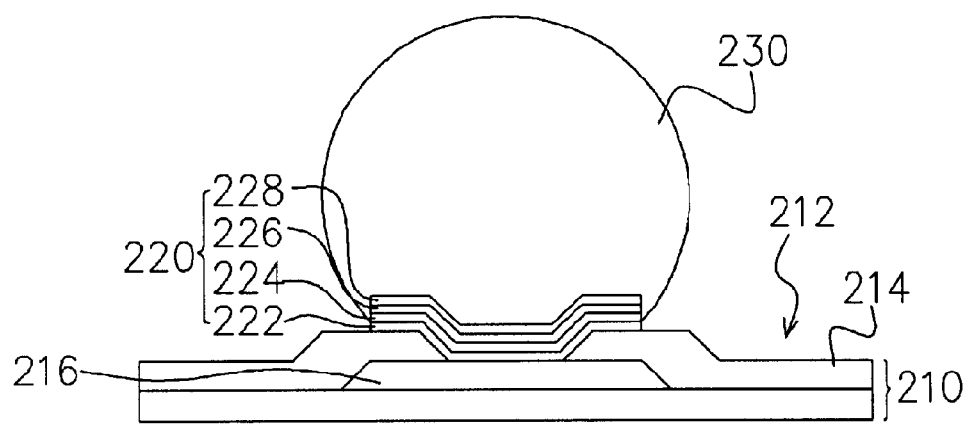
FIG. 2A is a schematic cross-sectional view of a first under-ball-metallurgy layer structure between the bonding pad of a chip and a solder bump according to one preferred embodiment of this invention.

FIG. 2A is a schematic cross-sectional view of a first under-ball-metallurgy layer structure between the bonding pad of a chip and a solder bump according to one preferred embodiment of this invention. The flip-chip package 200 in FIG. 2A includes a chip 210, a composite under-ball-metallurgy layer 220 and a plurality of solder bumps 230 (only one is shown). The chip 210 has an active surface 212 having a passivation layer 214 and a plurality of bonding pads 216 (only one is shown) thereon. The passivation layer 214 exposes the bonding pads 216. Note that the chip 210 is fabricated using a semiconductor material such as silicon, germanium, silicon/germanium, gallium/arsenic, gallium/phosphorus, indium/arsenic or indium/phosphorus. The active surface 212 is the side of the chip 210 having the most active devices. The passivation layer 214 is fabricated using an inorganic substance such as silicon oxide, silicon nitride or phosphosilicate glass (PSG). The passivation layer 214 can also be a composite layer comprising a stack of inorganic material layers. The bonding pads 216 are fabricated using a metallic material such as aluminum, copper or an alloy of the two. In addition, the under-ball-metallurgy layer 220 serves as a junction interface between the bonding pad 216 and the solder bump 230.

As shown in FIG. 2A, the under-ball-metallurgy layer 220 further includes an adhesion layer 222, a nickel-vanadium layer 224, a wettable layer 226 and a barrier layer 228. The adhesion layer 222 provides a good bondability between the under-ball-metallurgy layer 220 and the bonding pad 216. In general, the adhesion layer 222 is fabricated using a material such as titanium, tungsten, titanium-tungsten alloy or chromium. However, the adhesion layer 222 may also be a composite layer fabricated using some of the aforementioned materials as well. The adhesion layer 222 is formed, for example, by sputtering over the bonding pad 216 of the chip 210 to a thickness between about 0.1 to 1 μm. The nickel-vanadium layer 224 is formed, for example, by sputtering over the adhesion layer 222 to a thickness between about 0.1 to 1 μm. The wettable layer 226 is fanned over the nickel-vanadium layer 224 in an electroplating/electroless plating or a sputtering and electroplating/electroless plating operation. The wettable layer 226 Is able to wet the bump material so that bonding strength between the two is improved. The wettable layer 226 having a thickness between about 0.3 to 1 μm is fabricated using a material such as copper, nickel, iron, cobalt or metallic alloy.

As shown in FIG. 2A, the barrier layer 228 is formed over the wettable layer 226. Since the barrier layer 228 mainly serves to prevent nickel atoms within the nickel-vanadium layer 224 from diffusing into the solder bump 230, the barrier layer 228 must have properties for blocking nickel penetration. The barrier layer 228 is fabricated using a material such as nickel, iron, cobalt or metallic alloy. The barrier layer 228 can also be a composite layer that includes a stack of metallic layers fabricated using the metals or metallic alloy. The barrier layer 228 having a thickness between about 0.3 to 1 μm is formed over the wettable layer 226, for example, by electroplating. Tin within the solder bump 230 may react with the barrier layer 228 to form an inter-metallic compound that reduces the growing rate of inter-metallic compound $Ni_3Sn_4$ resulting from a reaction between the tin within the solder bump 230 and the nickel within the nickel-vanadium layer 224.

As shown in FIG. 2A, the solder bump 230 is formed over the under-ball-metallurgy layer 220. The solder bump 230 is fabricated using a material such as lead-tin alloy. In general, the solder bump 230 may contain 63% of tin and 37% of lead or 5% tin and 95% lead. The solder bump 230 can also be a composite layer with each layer having one of the aforementioned lead-tin compositions. However, the solder bump 230 can also be fabricated using a lead-free material, for example, tin, tin-copper alloy, tin-technetium alloy, tin-bismuth alloy, tin-indium alloy, tin-zinc alloy, tin-silver alloy, tin-bismuth-silver alloy, tin-bismuth-technetium alloy, tin-bismuth-zinc alloy, tin-bismuth-indium alloy or tin-silver-copper alloy. Note that the principle goal of this invention is to provide an under-ball-metallurgy layer 220 capable of preventing the formation of lumpy and discontinuous inter-metallic compound due to a reaction between the nickel within the nickel-vanadium layer 224 and the tin within the tin-based solder bump 230.

Figure 2B:
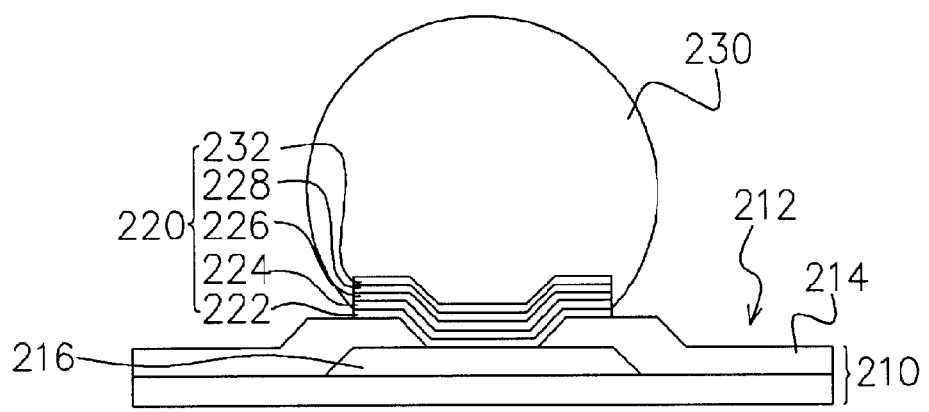
FIG. 2B is a schematic cross-sectional view of a first under-ball-metallurgy layer structure between the bonding pad of a chip and a solder bump just like the one in FIG. 2A but with the addition of a wettable layer.

FIG. 2B is a schematic cross-sectional view of a first under-ball-metallurgy layer structure between the bonding pad of a chip and a solder bump just like the one in FIG. 2A but with the addition of a wettable layer. In FIG. 2A, the barrier layer 228 is formed over the wettable layer 226. When the material forming the barrier layer 228 cannot provide a good bonding strength between the under-ball-metallurgy layer 220 and the solder bump 230, an additional wettable layer 232 may form on the barrier layer 228 as shown in FIG. 2B. The added wettable layer 232 may be fabricated using a material such as copper or copper alloy. Since the structural, material, processing and thickness relationship between various other layers within the under-ball-metallurgy layer 220 remain unchanged, detailed description of each layer is not repeated here.

Figure 3A:
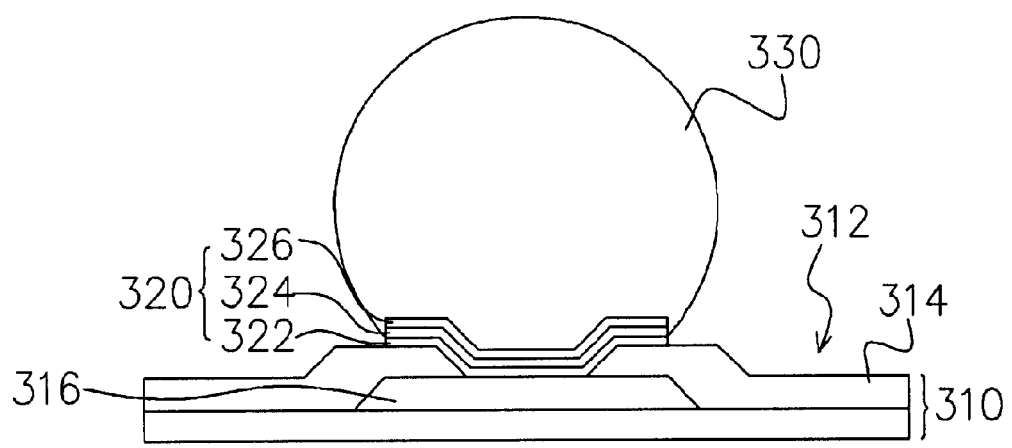
FIG. 3A is a schematic cross-sectional view of a second under-ball-metallurgy layer structure between the bonding pad of a chip and a solder bump according to one preferred embodiment of this invention.
Figure 3B:
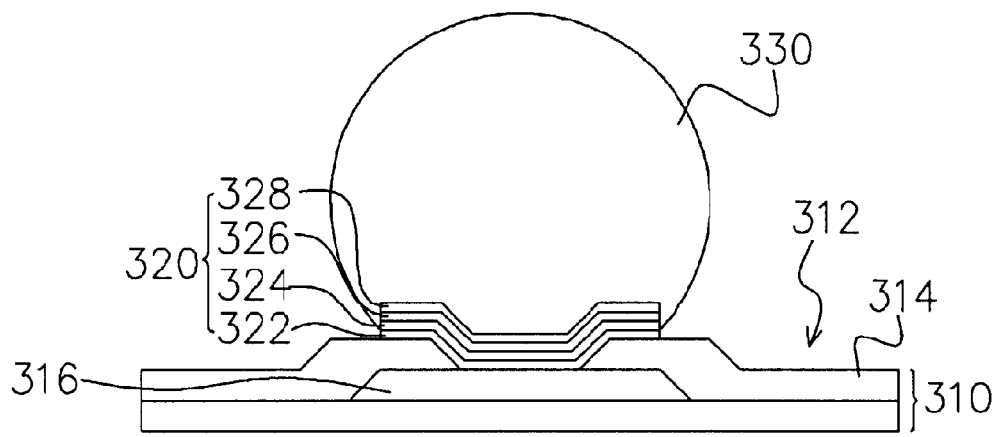
FIG. 3B is a schematic cross-sectional view of a second under-ball-metallurgy layer structure between the bonding pad of a chip and a solder bump just like the one in FIG. 3A but with the addition of a wettable layer.

Similarly, to reduce the formation of lumpy and discontinuous inter-metallic compound due to reaction between the tin within the solder bump and the nickel within the barrier layer, this invention also provides a second under-ball-metallurgy layer design as shown in FIGS. 3A and 3B.

FIG. 3A is a schematic cross-sectional view of a second under-ball-metallurgy layer structure between the bonding pad of a chip and a solder bump according to one preferred embodiment of this invention. The flip chip structure 300 in FIG. 3A includes a chip 310, a composite under-ball-metallurgy layer 320 and a plurality of solder bumps (only one is shown). Because the flip chip structure 300 is very similar to the flip chip structure 200 in FIG. 2A, only the under-ball-metallurgy layer 320 is described in detail. The under-ball-metallurgy layer 320 mainly comprises an adhesion layer 322, a wettable layer 324 and a nickel-vanadium layer 326. The adhesion layer 322 is formed over the bonding pad 316, the wettable layer 324 is formed over the adhesion layer 322 and the nickel-vanadium layer 326 is formed over the wettable layer 324. The solder bump 330 is formed over the nickel-vanadium layer 326. Note that the wettable layer 324 and the nickel-vanadium layer 326 within the under-ball-metallurgy layer 320 are the same as the nickel-vanadium barrier layer 124 and the wettable layer 126 in FIG. 1 with their positions reversed.

As shown in FIG. 3A, if the major constituent of the wettable layer 324 is copper and the major constituent of the nickel-vanadium layer 326 is nickel-vanadium alloy, nickel within the nickel-vanadium layer 326 may react with tin within the solder bump to form inter-metallic compound $Ni_3Sn_4$ after a thermal treatment (such as a reflow process). However, the inter-metallic compound is no longer in a lumpy and discontinuous structure. Hence, the original bonding strength between the solder bump 330 and the bonding pad 316 can be maintained for a very long time. In addition, a sputtering method may be employed to form the nickel-vanadium layer 326 over the wettable layer 324 if the principle constituent of the nickel-vanadium layer 326 is nickel-vanadium alloy.

FIG. 3B is a schematic cross-sectional view of a second under-ball-metallurgy layer structure between the bonding pad of a chip and a solder bump just like the one in FIG. 3A but with the addition of a wettable layer. To increase the bonding strength between the under-ball-metallurgy layer 320 and the solder bump 330, an additional wettable layer 328 may form over the nickel-vanadium layer 326 just like the under-ball-metallurgy layer 220 shown in FIG. 2B. The wettable layer 328 is fabricated using a metallic material that can wet the solder bump 330 material such as copper or copper alloy.

The first type of under-ball-metallurgy layer structure is an improvement on the nickel-vanadium barrier layer of a conventional under-ball-metallurgy layer. The first type of under-ball-metallurgy layer has an additional barrier layer formed over the wettable layer of a conventional under-ball-metallurgy layer for reacting with the tin within the solder bump to form an inter-metallic compound. Hence, growth rate of inter-metallic compound $Ni_3Sn_4$ due to reaction between the tin within the solder bump and the nickel within the nickel-vanadium layer (nickel-vanadium alloy barrier layer) is effectively reduced. In this way, the original bonding strength between the solder bump and the bonding pad can be maintained for a very long time so that the solder bump rarely peels away from the under-ball-metallurgy layer. In other words, the ultimately formed chip package can have a longer working life.

Similarly, the second type of under-ball-metallurgy layer structure is also an improvement on the nickel-vanadium barrier layer of a conventional under-ball-metallurgy layer. The second type of under-ball-metallurgy layer includes a nickel-vanadium barrier layer and a wettable layer just like a conventional under-ball-metallurgy layer except that the position of the two layers are reversed. Hence, the nickel-vanadium layer is closer to the solder bump. During a reflow operation, nickel within the nickel-vanadium layer may react with tin within the neighboring solder bump to form an inter-metallic compound $Ni_3Sn_4$ no longer gathered into discontinuous lumps. In this way, the original bonding strength between the solder bump and the bonding pad can be maintained for a very long time so that the solder bump rarely peels away from the under-ball-metallurgy layer. In other words, the ultimately formed chip package can have a longer working life.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An under-ball-metallurgy layer between a bonding pad on a chip and a solder bump, wherein material of the solder bump includes tin, the under-ball-metallurgy layer at least comprising:

an adhesion layer over the pad with a portion of said adhesion layer being direct contact with said bonding pad;

a wettable layer over the adhesion layer; and a nickel-vanadium layer over the wettable layer.

2. The under-ball-metallurgy layer of claim 1, wherein the adhesion layer includes one selected from the group consisting of titanium, tungsten, titanium-tungsten alloy and chromium.

3. The under-ball-metallurgy layer of claim 1, wherein the nickel-vanadium layer includes a sputtering nickel-vanadium layer.

4. The under-ball-metallurgy layer of claim 1, wherein the wettable layer includes one selected from the group consisting of copper, nickel, iron and cobalt.

5. The under-ball-metallurgy layer of claim 1, wherein the under-ball-metallurgy layer may further include a second wettable layer made of copper or copper alloy over the nickel-vanadium layer.

6. An under-ball-metallurgy layer between a bonding pad on a chip and a solder bump, wherein material of the solder bump includes tin, the under-ball-metallurgy layer at least comprising:

an adhesion layer over the bonding pad;

a nickel-vanadium layer over the adhesion layer;

a wettable layer over the nickel-vanadium layer; and a barrier layer over the wettable layer.

7. The under-ball-metallurgy layer of claim 6, wherein the barrier layer includes a material selected from the group consisting of nickel, iron and cobalt.

8. The under-ball-metallurgy layer of claim 6, wherein the adhesion layer includes one selected from the group consisting of titanium, tungsten, titanium-tungsten alloy and chromium.

9. The under-ball-metallurgy layer of claim 6, wherein the wettable layer includes one selected from the group consisting of copper, nickel, iron and cobalt.

10. The under-ball-metallurgy layer of claim 6, wherein the adhesion layer includes a sputtering adhesion layer 11. The under-ball-metallurgy layer of claim 6, wherein the nickel-vanadium layer includes a sputtering nickel-vanadium layer.

12. The under-ball-metallurgy layer of claim 6, wherein the wettable layer is farmed by sputtering, electroplating or electroless plating.

13. The under-ball-metallurgy layer of claim 6, wherein the barrier layer includes an electroplating barrier layer.

14. The under-ball-metallurgy layer of claim 6, wherein the under-ball-metallurgy layer further includes a second wettable layer made of copper or copper alloy over the barrier layer.

15. An under-ball-metallurgy layer between a bonding pad on a chip and a solder bump, wherein material of the solder bump includes tin, the under-ball-metallurgy layer at least comprising:

an adhesion layer over the bonding pad;

a nickel-vanadium layer over the adhesion layer;

a wettable layer over the nickel-vanadium layer; and a barrier layer over the wettable layer, wherein the barrier layer is a barrier preventing the penetration of nickel atoms from the nickel-vanadium layer.

16. The under-ball-metallurgy layer of claim 15, wherein the barrier layer includes one selected from the group consisting of nickel, iron and cobalt.

17. The under-ball-metallurgy layer of claim 15, wherein the adhesion layer includes one selected from the group consisting of titanium, tungsten, titanium-tungsten alloy and chromium.

18. The under-ball-metallurgy layer of claim 15, wherein the wettable layer includes one selected from the group consisting of copper, nickel, iron and cobalt.

19. The under-ball-metallurgy layer of claim 15, wherein the under-ball-metallurgy layer may further include a second wettable layer made of copper or copper alloy over the barrier layer.

* * * * *